(12) United States Patent
Kanno et al.

(10) Patent No.: US 8,320,158 B2
(45) Date of Patent: Nov. 27, 2012

(54) NONVOLATILE SEMICONDUCTOR MEMORY DEVICE

(75) Inventors: Hiroshi Kanno, Yokkaichi (JP); Reika Ichihara, Yokohama (JP); Takayuki Tsukamoto, Yokkaichi (JP); Kenichi Murooka, Yokkaichi (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/882,685

(22) Filed: Sep. 15, 2010

(65) Prior Publication Data

US 2011/0103128 A1 May 5, 2011

(30) Foreign Application Priority Data

Nov. 4, 2009 (JP) ................................. 2009-253324

(51) Int. Cl.
*G11C 11/00* (2006.01)
(52) U.S. Cl. ..................... 365/148; 365/189.16; 365/218
(58) Field of Classification Search .................. 365/148, 365/189.16, 218, 189.01, 189.05, 163, 189.07, 365/230.03
See application file for complete search history.

(56) References Cited

U.S. PATENT DOCUMENTS

| 3,733,435 | A | * | 5/1973 | Chodil et al. | 348/797 |
| 8,068,358 | B2 | * | 11/2011 | Maejima | 365/148 |
| 2009/0010039 | A1 | * | 1/2009 | Tokiwa et al. | 365/148 |
| 2009/0296458 | A1 | * | 12/2009 | Lee et al. | 365/163 |

FOREIGN PATENT DOCUMENTS

| JP | 2005-522045 | 7/2005 |
| JP | 2006-510153 | 3/2006 |
| JP | 2009-99199 | 5/2009 |
| WO | WO 03/085675 A2 | 10/2003 |
| WO | WO 03/085675 A3 | 10/2003 |
| WO | WO 2004/055827 A1 | 7/2004 |

OTHER PUBLICATIONS

U.S. Appl. No. 13/052,174, filed Mar. 21, 2011, Shimotori, et al.
U.S. Appl. No. 13/230,010, filed Sep. 12, 2011, Sonehara.
U.S. Appl. No. 13/234,796, filed Sep. 16, 2011, Takashima et al.

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

Nonvolatile semiconductor memory device of an embodiment includes: a memory cell array including a plurality of first and second lines intersecting each other and plural memory cells provided at intersections of the first and second lines and having data written and erased upon application of voltages of the same polarity; and a writing circuit configured to select first and second lines and supply a set or reset pulse to the memory cell through the selected first and second lines. In an erase operation, the writing circuit repeatedly supplies the reset pulse to a selected memory cell until data is erased, by increasing or decreasing voltage level and voltage application time of the reset pulse within a reset region. The reset region, or an aggregate of combinations of voltage level and voltage application time of the reset pulse, is a region where voltage level and voltage application time are negatively correlated.

17 Claims, 5 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2009-253324, filed on Nov. 4, 2009, the entire contents of which are incorporated herein by reference.

BACKGROUND

1. Field

Embodiments described herein relate generally to a nonvolatile semiconductor memory device.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memories are attracting attention as a candidate to succeed these kinds of semiconductor memory devices utilizing a MOSFET as a memory cell (see, for example, patent document 1: JP 2005-522045 W). Resistance varying memories include: a resistance varying memory in the narrowly-defined meaning (ReRAM: Resistive RAM), which stores, in a nonvolatile manner, a resistance state of its recording layer made of a transition metal oxide; and a phase change memory (PCRAM: Phase Change RAM) which uses chalcogenide, etc. as its recording layer and utilizes the resistance information of the chalcogenide in its crystalline state (conductive) and its amorphous state (insulative).

It is known that the resistance varying memories use two types of variable resistance elements. One is called bipolar type which is set to a high resistance state and a low resistance state by switching the polarities of the voltages to apply. The other is called unipolar type which can be set to a high resistance state and a low resistance state not by switching the polarities of the voltages to apply, but by controlling the voltage values.

The unipolar type is preferred in order to realize a high-density memory cell array, because when the unipolar type is used, it is possible to configure a cell array not by using a transistor but by stacking a variable resistance element and a rectifying element such as a diode, etc. at the intersections of bit lines and word lines. Furthermore, if such memory cell arrays are stacked three-dimensionally, transistors become unnecessary, which makes it possible to realize a large memory capacity without increasing the cell array area.

In a unipolar type ReRAM, write of data into a memory cell is executed by applying a certain voltage to the variable resistance element for a certain time. As a result, the variable resistance element changes from a high resistance state to a low resistance state. Hereinafter, this operation of changing the variable resistance element from a high resistance state to a low resistance state will be referred to as set operation.

On the other hand, erase of data from a memory cell is executed by applying a certain voltage lower than the voltage in the set operation for a certain time to the variable resistance element having undergone the set operation and hence currently existing in a low resistance state. As a result, the variable resistance element changes from a low resistance state to a high resistance state. Hereinafter, this operation of changing the variable resistance element from a low resistance state to a high resistance state will be referred to as reset operation. A memory cell is defined as being in a stable state (a reset state) when, for example, it is in a high resistance state. When a memory cell is configured to store binary data, data is written into the memory cell by a set operation of changing the memory cell from the stable reset state to a low resistance state.

When setting or resetting a given cell, after a certain voltage is applied to the cell for a certain time, the cell is read by such a low voltage as would not change the resistance state of the memory cell, in order to confirm whether the cell is set or reset normally. When it is determined in this reading operation that the cell is not set or reset normally, a pulse having a voltage higher than that of the previous pulse by a certain value is applied to the cell for a certain time, and then a similar confirmation operation is executed. The above operations are repeated and voltage pulses are applied to the memory cell until the memory cell is set or reset normally.

The inventors herein have also promoted development of unipolar type ReRAM, and assessed pulse-driven set or reset operations by using a cell array of a practical level. As a result, it has been turned out that particularly in reset operations, so-called erroneous writing, which causes the reset target selected memory cell to be set again after it is reset, occurs at a high rate.

DETAILED DESCRIPTION

A nonvolatile semiconductor memory device according to an embodiment includes: a memory cell array including a plurality of first and second lines intersecting each other and a plurality of memory cells provided at the intersections of the first and second lines and having data written thereinto and erased therefrom upon application of voltages of the same polarity; and a writing circuit configured to select the first and second lines and supply a set pulse or a reset pulse to the memory cell through the selected first and second lines. In an erase operation, the writing circuit is configured to repeatedly supply the reset pulse to a selected one of the memory cells until data is erased from the selected memory cell, by increasing or decreasing the voltage level and the voltage application time of the reset pulse within a reset region. The reset region, which is an aggregate of combinations of the voltage level and voltage application time of the reset pulse, is a region in which the voltage level and the voltage application time are negatively correlated with each other.

A nonvolatile semiconductor memory device according to an embodiment will now be explained in detail with reference to the drawings.

Figure 1:
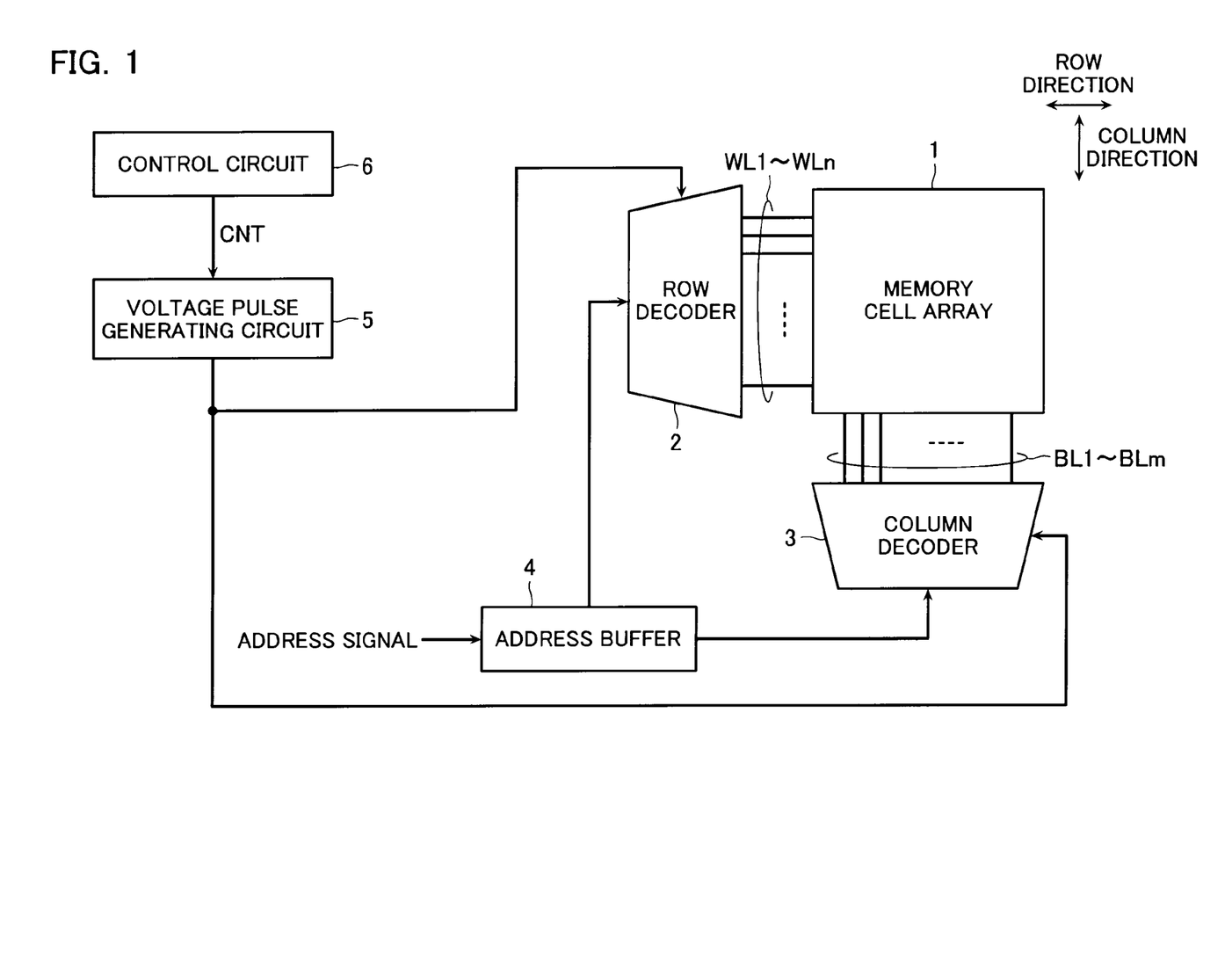
FIG. 1 is a block diagram of a nonvolatile memory according to an embodiment.

FIG. 1 is a block diagram of a nonvolatile memory according to an embodiment.

This nonvolatile memory includes a memory cell array 1 including a plurality of word lines WL1 to WLn (n being an integer equal to or greater than 2) as first lines extending in a row direction, a plurality of bit lines BL1 to BLm (m being an integer equal to or greater than 2) as second lines extending in a column direction, and a plurality of memory cells (not shown) provided at the intersections of the word lines WL and the bit lines BL. The nonvolatile memory further includes a row decoder 2 as a first decoder which is configured to select the word lines WL and provided at one end of the memory cell array 1 in the row direction, and a column decoder 3 as a second decoder which is configured to select the bit lines BL and provided at one end of the memory cell array 1 in the column direction. The nonvolatile memory further includes an address buffer 4 configured to manage an externally supplied address signal, a voltage pulse generating circuit 5 configured to generate a voltage pulse necessary for read, erase, or write of data from or into the memory cells, and a control circuit 6 configured to control the voltage pulse generating circuit 5. Among them, the row decoder 2, the column decoder 3, the address buffer 4, the voltage pulse generating circuit 5, and the control circuit 6 constitute part of a writing circuit.

An address signal designating the address of a certain memory cell is input to the address buffer 4 in a read, write, or erase operation. A part of the address signal is input to the row decoder 2 from the address buffer 4, and another part of the address signal is input to the column decoder 3 from the address buffer 4.

The row decoder 2 selects one of the plurality of word lines WL based on the address signal. The column decoder 3 selects one of the plurality of bit lines BL based on the address signal.

The control circuit 6 sends a control signal CNT to the voltage pulse generating circuit 5 in a write or erase operation. The control signal CNT designates the level (voltage) and the pulse width (voltage application time) of a voltage pulse which should be output by the voltage pulse generating circuit 5.

Upon receiving the control signal CNT, the voltage pulse generating circuit 5 generates a voltage pulse having a certain height (voltage) and a certain duration (pulse width).

The voltage pulse output by the voltage pulse generating circuit 5 is supplied to a certain selected word line WL via the row decoder 2, and to a certain selected bit line BL via the column decoder 3.

Figure 2:
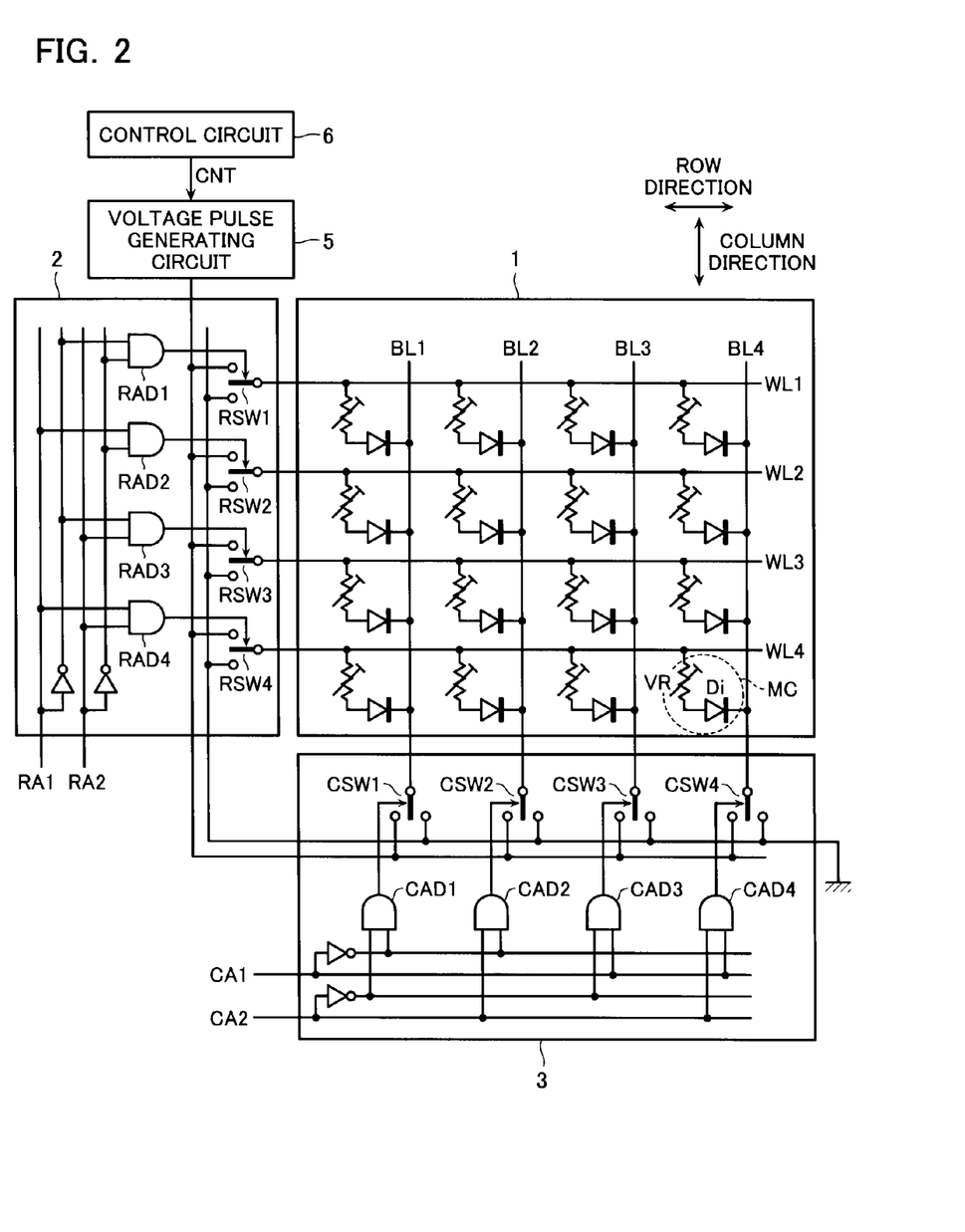
FIG. 2 is a circuit diagram of a memory cell array of the nonvolatile memory according to the embodiment and its peripherals.

FIG. 2 is a diagram showing example circuits of the memory cell array 1, the row decoder 2 and the column decoder 3 shown in FIG. 1. In the present example, for ease of explanation, it is assumed that there are four word lines WL and four bit lines BL.

In the memory cell array 1, the four word lines WL1 to WL4 extend in the row direction, and the four bit lines BL1 to BL4 extend in the column direction. The memory cells MC are provided at the intersections of the word lines WL1 to WL4 and the bit lines BL1 to BL4. The memory cells MC will be described in detail later.

In this memory cell array 1, the word lines WL1 to WL4 and the bit lines BL1 to BL4 are mere line-and-space patterns, and there is no need of considering misalignment between these upper and lower conductive lines. Accordingly, the memory cell array 1 can be easily manufactured with extremely loose demand for positioning accuracy in the array.

The row decoder 2 includes switch circuits RSW1 to RSW4 and AND circuits RAD1 to RAD4 configured to switch on/off the switch circuits RSW1 to RSW4 respectively. The switch circuits RSW1 to RSW4 and the AND circuits RAD1 to RAD4 are formed of, for example, CMOS circuits.

Next, an operation of the row decoder 2 will be explained.

When address signals RA1 and RA2 are both "L", the output of the AND circuit RAD1 becomes "H", and hence the word line WL1 is electrically connected via the switch circuit RSW1 to the voltage pulse generating circuit 5, which generates a voltage pulse having a voltage level (height) of a certain first voltage. At this time, the outputs of the AND circuits RAD2 to RAD4 are "L", and the word lines WL2 to WL4 are fixed via the switch circuits RSW2 to RSW4 to a fixed voltage (here, a ground voltage) of a second voltage different from the first voltage.

Likewise, when the address signals RA1 and RA2 are "HL", "LH", or "HH", the output of the AND circuit RAD2, RAD3, or RAD4 becomes "H", and the word line WL2, WL3, or WL4 is electrically connected via the switch circuit RSW2, RSW3, or RSW4 to the voltage pulse generating circuit 5. At this time, the word lines other than the selected word line are fixed to the fixed voltage.

On the other hand, the column decoder 3 includes switch circuits CSW1 to CSW4 and AND circuits CAD1 to CAD4 configured to switch on/off the switch circuits CSW1 to CSW4 respectively.

The switch circuits CSW1 to CSW4 and the AND circuits CAD1 to CAD4 are formed of, for example, CMOS circuits.

Next, an operation of the column decoder 3 will be explained.

When address signals CA1 and CA2 are both "L", the output of the AND circuit CAD1 becomes "H", and hence the bit line BL1 is fixed via the switch circuit CSW1 to a fixed voltage (here, a ground potential). At this time, the outputs of the AND circuits CAD2 to CAD4 are "L", and the bit lines BL2 to BL4 are electrically connected via the switch circuits CSW2 to CSW4 to the voltage pulse generating circuit 5.

Likewise, when the address signals CA1 and CA2 are "HL", "LH", or "HH", the output of the AND circuit CAD2, CAD3, or CAD4 becomes "H", and the bit line BL2, BL3, or BL4 is fixed via the switch circuit CSW2, CSW3, or CSW4 to the fixed voltage. At this time, the bit lines other than the selected bit line are electrically connected to the voltage pulse generating circuit 5.

Next, the memory cells MC will be explained.

As shown in FIG. 2, the memory cells MC are configured by a variable resistance element VR and a diode D1 which are connected in series.

The variable resistance element VR is an element which can vary its resistance via a current, heat, chemical energy, etc. upon voltage application, and includes electrodes which are provided at the top and bottom to function as a barrier metal and an adhesive layer. The electrode material may be Pt, Au, Ag, TiAlN, SrRuO, Ru, RuN, Ir, Co, Ti, TiN, TaN, LaNiO, Al, PtIrO$_x$, PtRhO$_x$, Rh/TaAlN, etc. The variable resistance element VR may include a metal layer that provides a uniform orientation. The variable resistance element VR may also specially include a buffer layer, a barrier metal layer, an adhesive layer, etc.

The variable resistance element VR may be an element (PCRAM) which varies its resistance by phase change between a crystal state and an amorphous state as observed in chalcogenide, etc., an element (CBRAM) which varies its resistance by forming a bridge (a conductive bridge) between electrodes by precipitating metal cations and destroying the bridge by ionizing the precipitated metal, an element (ReRAM) which varies its resistance upon voltage or current application (ReRAM is roughly divided into a type which varies its resistance according to presence or absence of charges trapped in a charge trap existing at an electrode interface and a type which varies its resistance according to presence or absence of a conducting path due to oxygen loss, etc.), etc.

Figure 3:
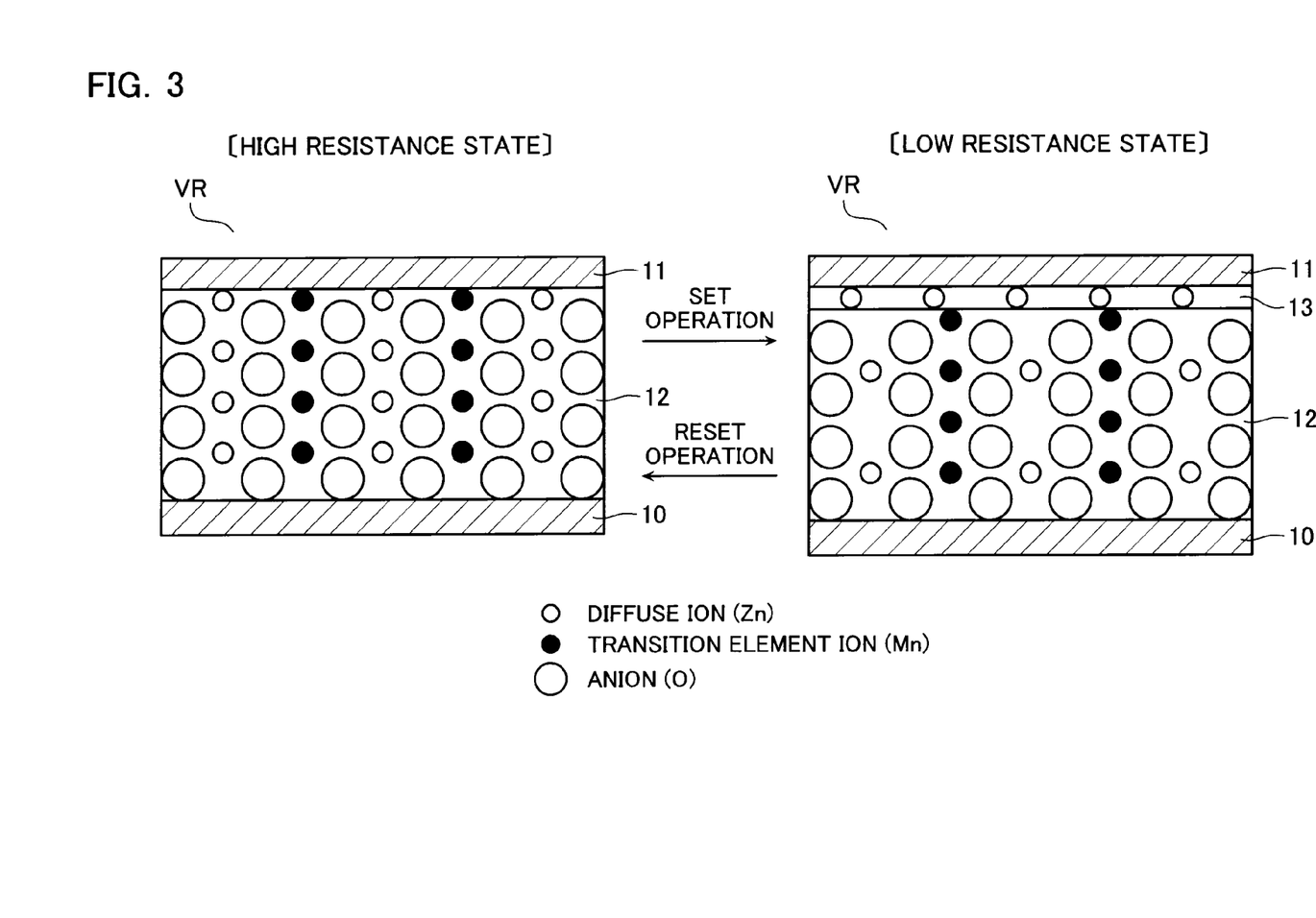
FIG. 3 is an exemplary sectional diagram showing an example of variable resistance element of the nonvolatile memory according to the embodiment.

FIG. 3 is a diagram showing an example of the variable resistance element VR. The variable resistance element VR shown in FIG. 3 includes electrode layers 10 and 11, and a recording layer 12 provided between them. The recording layer 12 is made of a complex compound containing at least two kinds of cationic elements. At least one kind of the cationic elements should be a transition element having a d-orbital incompletely filled with electrons, and the shortest distance between adjoining cationic elements should be 0.32 nm or shorter. Specifically, the recording layer 12 is made of a material which is represented by a chemical formula $A_xM_yX_z$ (where A and M are different elements), and which has a crystalline structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($AMO_2$), a ramsdellite structure ($A_xMO_2$), a perovskite structure ($AMO_3$), etc.

In the example of FIG. 3, A is Zn, M is Mn, and X is O. Small white circles in the recording layer 12 represent diffuse ions (Zn), large white circles represent anions (O), and small black circles represent transition element ions (Mn). An initial state of the recording layer 12 is a high resistance state. When a negative voltage is applied to the electrode layer 11 while the electrode layer 10 is set at a fixed potential, some diffuse ions in the recording layer 12 migrate toward the electrode layer 11, and hence diffuse ions in the recording layer 12 are reduced relative to anions. The diffuse ions having migrated toward the electrode layer 11 receive electrons from the electrode layer 11 and precipitate as a metal, thus forming a metal layer 13. In the recording layer 12, anions have become excessive, and this leads to an increase of the valence of the transition element ions in the recording layer 12. Hence, the recording layer 12 becomes electron-conductive due to carrier injection, and a set operation of the recording layer 12 is thus completed. To reproduce the data, such a minute current as would not induce a resistance change of the material of the recording layer 12 is caused to flow through the recording layer 12. To reset the programmed state (low resistance state) to the initial state (high resistance state), for example, a large current is caused to flow through the recording layer 12 for a sufficient time to cause Joule heating and promote the oxidoreduction reaction of the recording layer 12. It is also possible to execute a reset operation by applying an electric field in a direction opposite to the set operation.

Here, for understanding of an erase operation according to the present embodiment, an erase operation according to a comparative example will be glanced.

In the comparative example, an erase of a memory cell MC is realized by repeating supply of a voltage pulse necessary for resetting the variable resistance element VR (hereinafter referred to as "reset pulse") and verify of confirming whether erase has been effected normally, while maintaining the pulse width of the reset pulse constant whereas increasing the voltage level thereof.

However, according to this method of the comparative example, during a duration of one reset pulse, there often occurs erroneous writing which causes data to be written again after data is erased. The cause of such erroneous writing will be explained below.

Figure 4:
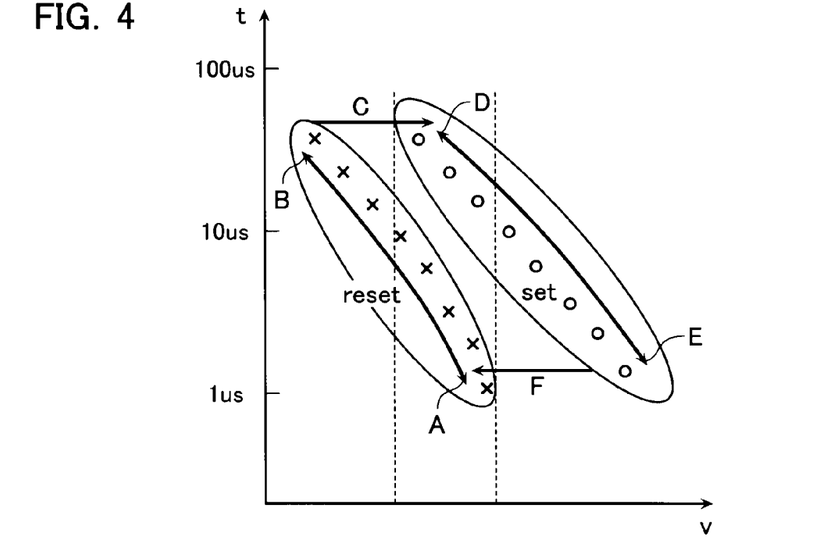
FIG. 4 is a diagram showing a relationship between voltages and pulse widths necessary for a set or reset operation of the nonvolatile memory according to the embodiment.

FIG. 4 is a diagram showing a relationship between an aggregate of combinations of the level (v) and the voltage application time (t) of a voltage pulse necessary for a set operation (hereinafter the aggregate will be referred to as "set region"), and an aggregate of combinations of the level and the voltage application time of a voltage pulse necessary for a reset operation (hereinafter the aggregate will be referred to as "reset region").

As can be understood from FIG. 4, although the set region and the reset region are separate regions in the voltage vs. voltage-application-time plane, they have ranges in which they share the same voltages, when the regions are projected on the voltage axis. Further, the voltage necessary for set or reset and the voltage application time are negatively correlated with each other, and hence when the voltage increases, the voltage application time decreases exponentially.

On this basis, when the conventional method is used and the voltage of the reset pulse is only increased with the pulse width thereof maintained constant, as the voltage of the reset pulse increases, the increase comes to interfere with the set region as indicated by the arrow C in FIG. 4. This is the cause of erroneous writing in the memory cell MC.

Figure 5:
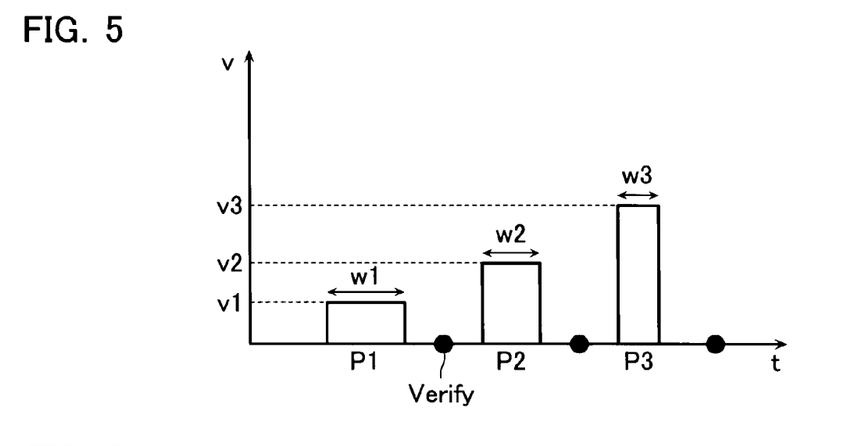
FIG. 5 is a diagram showing an example of voltage pulses in a reset operation of the nonvolatile memory according to the embodiment.
Figure 6:
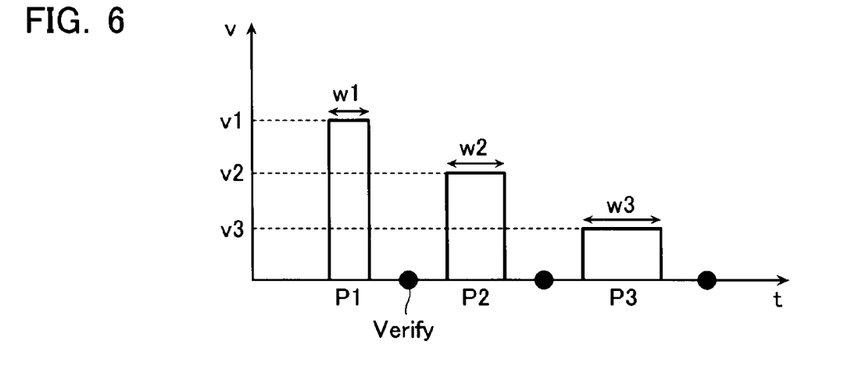
FIG. 6 is a diagram showing another example of voltage pulses in a reset operation of the nonvolatile memory according the embodiment.

Hence, according to the present embodiment, the control circuit 6 controls the reset pulse as shown in FIG. 5 or FIG. 6. FIG. 5 and FIG. 6 show cases where the voltage and pulse width (voltage application time) of the reset pulse are controlled in the direction of the arrow A or the arrow B shown in FIG. 4, based on the control points (x marks in FIG. 4) provided within the reset region and outside the set region.

As can be understood from FIG. 4, since the arrow A heads in the direction to increase the voltage of the reset pulse and decrease the pulse width, the voltages v1 to v3 of reset pulses P1 to P3 have a relationship of v1<v2<v3 whereas the pulse widths w1 to w3 of the reset pulses P1 to P3 have a relationship of w1>w2>w3 as shown in FIG. 5.

On the other hand, since the arrow B heads in the direction to decrease the voltage of the reset pulse and increase the pulse width, the voltages v1 to v3 of the reset pulses P1 to P3 have a relationship of v1>v2>v3 whereas the pulse widths w1 to w3 of the reset pulses P1 to P3 have a relationship of w1<w2<w3 as shown in FIG. 6.

By controlling the voltage level and pulse width of the reset pulse within the reset region and outside the set region in the manner described above, it is possible to supply the reset pulse to the variable resistance element VR without causing interference with the set region as in the conventional erase method.

Hence, according to the present embodiment, it is possible to prevent interference with the set region in the erase operation and realize a more stable erase operation than realized by the conventional method.

The above explanation has described the reset pulse in the erase operation, but a voltage pulse necessary for a set operation in the write operation (hereinafter referred to as "set pulse") is in a similar situation. That is, it is possible to prevent interference with the reset region as indicated by the arrow F in FIG. 4 in the write operation, by controlling the voltage level and the pulse width of the set pulse in the direction of the arrow D or the arrow E shown in FIG. 4 based on the control points (○ marks in FIG. 4) provided within the set region and outside the reset region.

In this case, it is possible to suppress erroneous erasing in the write operation, and realize a more stable write operation than realized by a conventional method of increasing or decreasing the voltage of the set pulse while maintaining the pulse width thereof constant.

Figure 7A:
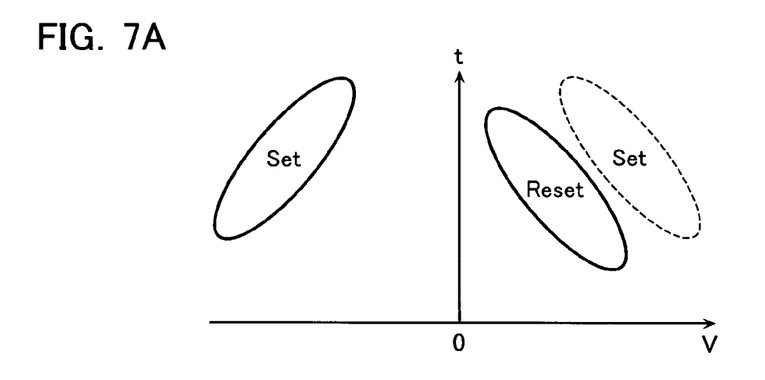
FIG. 7A to FIG. 7C are diagrams showing relationships between voltages and pulse widths necessary for a set or reset operation of the nonvolatile memory according to the embodiment.

In addition, when interference between the set region and the reset region is feared to occur also in a bipolar operation shown in FIG. 7A in which the set voltages have no polarity differences and the set operation and the reset operation apply pulses of different polarities, if the voltage and time are controlled in a similar manner to the above, a stable erase operation can be realized.

Figure 7B:
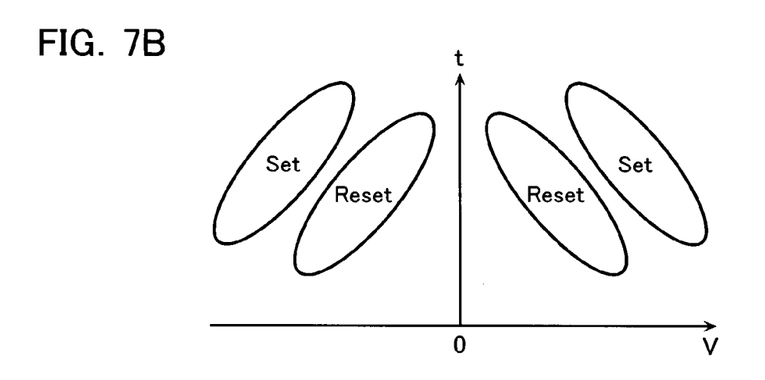
Figure 7C:
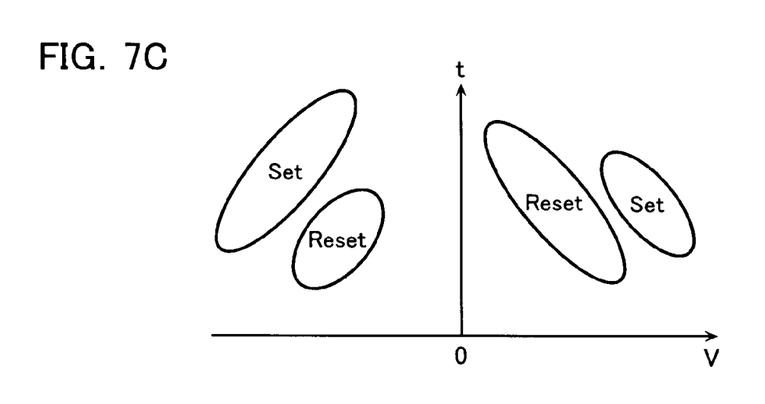

Likewise, when the set and reset operations both operate with both of the polarities but there are no polarity differences as shown in FIG. 7B or when the set and reset operations both operate with both the polarities and there are polarity differences as shown in FIG. 7C, if the voltage and time are controlled in a similar manner to the above, stable write and erase operations can be realized both in a bipolar operation and a unipolar operation.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including a plurality of first and second lines intersecting each other and a plurality of memory cells provided at intersections of the first and second lines and having data written thereinto and erased therefrom upon application of voltages; and
   a writing circuit configured to select the first and second lines and supply a set pulse or a reset pulse to the memory cell through the selected first and second lines,
   in an erase operation, the writing circuit being configured to repeatedly supply the reset pulse to a selected one of the memory cells until data is erased from the selected memory cell, by increasing or decreasing the voltage level and the voltage application time of the reset pulse within a reset region,
   the reset region being an aggregate of combinations of voltage level and voltage application time of the reset pulse, and the reset region being a region in which the voltage level and the voltage application time are inversely correlated with each other, and
   in an erase operation, the writing circuit controlling the voltage level and the voltage application time of the reset pulse outside a set region which is an aggregate of combinations of voltage level and voltage application time of the set pulse.

2. The nonvolatile semiconductor memory device according to claim 1, wherein in an erase operation, the writing circuit controls the voltage application time of the reset pulse exponentially with respect to the voltage level of the reset pulse.

3. The nonvolatile semiconductor memory device according to claim 1, wherein in a write operation, the writing circuit repeatedly supplies the set pulse to the selected memory cell until data is written in the selected memory cell, by increasing or decreasing voltage level and voltage application time of the set pulse within a set region and outside the reset region.

4. The nonvolatile semiconductor memory device according to claim 1, wherein in an erase operation, the writing circuit repeatedly supplies the reset pulse to the selected memory cell until data is erased from the selected memory cell, by increasing the voltage level of the reset pulse.

5. The nonvolatile semiconductor memory device according to claim 1, wherein in an erase operation, the writing circuit repeatedly supplies the reset pulse to the selected memory cell until data is erased from the selected memory cell, by decreasing the voltage level of the reset pulse.

6. The nonvolatile semiconductor memory device according to claim 1, wherein in an erase operation, the writing circuit repeatedly supplies the reset pulse to the selected memory cell until data is erased from the selected memory cell, by increasing the voltage application time of the reset pulse.

7. The nonvolatile semiconductor memory device according to claim 1, wherein in an erase operation, the writing circuit repeatedly supplies the reset pulse to the selected memory cell until data is erased from the selected memory cell, by decreasing the voltage application time of the reset pulse.

8. The nonvolatile semiconductor memory device according to claim 1, wherein the writing circuit includes:
   a first decoder configured to apply a certain first voltage to a selected one of the first lines and apply a certain second voltage different from the first voltage to the other first lines; and
   a second decoder configured to apply the second voltage to a selected one of the second lines and apply the first voltage to the other second lines.

9. A nonvolatile semiconductor memory device, comprising:
   a memory cell array including a plurality of first and second lines intersecting each other and a plurality of memory cells provided at intersections of the first and second lines and having data written thereinto and erased therefrom upon application of voltages; and
   a writing circuit configured to select the first and second lines and supply a set pulse or a reset pulse to the memory cell through the selected first and second lines,
   in a write operation, the writing circuit being configured to repeatedly supply the set pulse to a selected one of the memory cells until data is written in the selected memory cell, by increasing or decreasing the voltage level and the voltage application time of the set pulse within a set region,
   the set region being an aggregate of combinations of voltage level and voltage application time of the set pulse, and the set region being a region in which the voltage level and the voltage application time are inversely correlated with each other, and in a write operation, the writing circuit controlling the voltage level and the voltage application time of the set pulse outside a reset region which is an aggregate of combinations of voltage level and voltage application time of the reset pulse.

10. The nonvolatile semiconductor memory device according to claim 9, wherein in a write operation, the writing circuit controls the voltage application time of the set pulse exponentially with respect to the voltage level of the set pulse.

11. A nonvolatile semiconductor memory device, comprising:
a memory cell array including a plurality of first and second lines intersecting each other and a plurality of memory cells provided at intersections of the first and second lines; and
a writing circuit configured to select the first and second lines and supply a set pulse or a reset pulse to the memory cell through the selected first and second lines,
the memory cells each including: a variable resistance element having a resistance varied upon application of the set pulse or the reset pulse; and a rectifying element connected in series to the variable resistance element,
in an erase operation, the writing circuit being configured to repeatedly supply the reset pulse to a selected one of the memory cells until data is erased from the selected memory cell, by increasing or decreasing voltage level and voltage application time of the reset pulse within a reset region which is an aggregate of combinations of the voltage level and the voltage application time of the reset pulse, and in an erase operation, the writing circuit controlling the voltage level and the voltage application time of the reset pulse outside a set region which is an aggregate of combinations of voltage level and voltage application time of the set pulse.

12. The nonvolatile semiconductor memory device according to claim 11, wherein in an erase operation, the writing circuit controls the voltage application time of the reset pulse exponentially with respect to the voltage level of the reset pulse.

13. The nonvolatile semiconductor memory device according to claim 11, wherein in a write operation, the writing circuit repeatedly supplies the set pulse to the selected memory cell until data is written in the selected memory cell, by increasing or decreasing voltage level and voltage application time of the set pulse within a set region and outside the reset region.

14. The nonvolatile semiconductor memory device according to claim 11, wherein in an erase operation, the writing circuit repeatedly supplies the reset pulse to the selected memory cell until data is erased from the selected memory cell, by increasing the voltage level of the reset pulse.

15. The nonvolatile semiconductor memory device according to claim 11, wherein in an erase operation, the writing circuit repeatedly supplies the reset pulse to the selected memory cell until data is erased from the selected memory cell, by decreasing the voltage level of the reset pulse.

16. The nonvolatile semiconductor memory device according to claim 11, wherein the variable resistance element comprises a ReRAM.

17. The nonvolatile semiconductor memory device according to claim 11, wherein the rectifying element is a diode.

* * * * *